(12) United States Patent
Zhong et al.

(10) Patent No.: US 7,709,178 B2
(45) Date of Patent: May 4, 2010

(54) ALKALINE-RESISTANT NEGATIVE PHOTORESIST FOR SILICON WET-ETCH WITHOUT SILICON NITRIDE

(75) Inventors: Xing-Fu Zhong, Rolla, MO (US); Tony D. Flaim, St. James, MO (US); Jyoti Malhotra, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 11/736,429

(22) Filed: Apr. 17, 2007

(65) Prior Publication Data

US 2008/0261145 A1   Oct. 23, 2008

(51) Int. Cl.
G03F 7/00 (2006.01)
G03F 7/004 (2006.01)

(52) U.S. Cl. ............... 430/270.1; 430/907; 430/914
(58) Field of Classification Search ............ 430/270.1, 430/907, 914
See application file for complete search history.

(56) References Cited

U.S. PATENT DOCUMENTS

| | | | |
|---|---|---|---|
| 3,398,044 A | 8/1968 | Plueddemann | |
| 3,461,027 A | 8/1969 | Plueddemann | |
| 3,468,834 A | 9/1969 | Oda et al. | |
| 3,585,103 A | 6/1971 | Thomson | |
| 3,826,709 A | 7/1974 | Humphries | |
| 4,800,125 A | 1/1989 | Plueddemann | |
| 4,826,564 A * | 5/1989 | Desilets et al. ............ | 216/49 |
| 4,882,245 A | 11/1989 | Gelorme et al. | |
| 5,077,174 A | 12/1991 | Bauer et al. | |
| 5,100,503 A * | 3/1992 | Allman et al. ............ | 438/694 |
| 5,217,568 A | 6/1993 | Tessier et al. | |
| 5,353,705 A | 10/1994 | Lewis et al. | |
| 5,585,450 A | 12/1996 | Oaks et al. | |
| 5,753,523 A | 5/1998 | Giedd et al. | |
| 5,874,365 A | 2/1999 | Tomita et al. | |
| 5,922,410 A * | 7/1999 | Swartz et al. ............ | 427/393 |
| 6,162,860 A | 12/2000 | Anderson et al. | |
| 6,358,665 B1 | 3/2002 | Pawlowski et al. | |
| 6,773,862 B2 * | 8/2004 | Shirakawa et al. ....... | 430/270.1 |
| 6,773,867 B2 * | 8/2004 | Nozaki et al. ............ | 430/313 |
| 6,878,502 B2 | 4/2005 | Mizutani et al. | |

(Continued)

FOREIGN PATENT DOCUMENTS

EP          0 539 973          5/1993

(Continued)

OTHER PUBLICATIONS

Bishop, David, Arthur Heuer, and David Williams, *Microelectromechanical Systems: Technology and Applications*, MRS Bulletin, Apr. 2001, pp. 282-288.

(Continued)

*Primary Examiner*—Amanda C. Walke
(74) *Attorney, Agent, or Firm*—Hovey Williams LLP

(57) ABSTRACT

New photoresists for use during the production of semiconductor and MEMS devices are provided. The primer layer preferably comprises a silane dissolved or dispersed in a solvent system. The photoresist layer includes a first polymer prepared from a styrene and an acrylonitrile, and a second polymer comprising epoxy-containing monomers (and preferably phenolic-containing monomers). The photoresist layer comprises a photoacid generator, and is preferably negative-acting.

40 Claims, 1 Drawing Sheet

U.S. PATENT DOCUMENTS

| | | | |
|---|---|---|---|
| 6,956,268 | B2 | 10/2005 | Faris |
| 7,049,164 | B2 | 5/2006 | Bruner |
| 7,316,844 | B2 * | 1/2008 | Li et al. ............... 428/421 |
| 2002/0051928 | A1 | 5/2002 | Zampini |
| 2002/0058749 | A1 | 5/2002 | Larson et al. |
| 2002/0185199 | A1 | 12/2002 | Myers et al. |
| 2003/0216508 | A1 * | 11/2003 | Lee ............... 525/67 |
| 2005/0037281 | A1 | 2/2005 | Sato et al. |
| 2005/0158538 | A1 | 7/2005 | Li et al. |
| 2006/0070441 | A1 | 4/2006 | Durante et al. |
| 2006/0166393 | A1 | 7/2006 | Ha et al. |
| 2006/0166403 | A1 | 7/2006 | Ouellet et al. |

FOREIGN PATENT DOCUMENTS

| | | |
|---|---|---|
| JP | 2004-264623 | 9/2004 |
| JP | 2005-008847 | 1/2005 |
| WO | WO 02/087340 | 11/2002 |
| WO | WO 2005/052688 | 6/2005 |
| WO | WO 2006/046687 | 5/2006 |
| WO | WO 2007/030593 | 3/2007 |

OTHER PUBLICATIONS

Bodas, Dhananjay, Sheethal J. Patil, V.N. Krishnamurthy, and S.A. Gangal, "PMMA as an etch mask for silicon micromachining-a feasibility study", *J. Indian Inst. Sci.*, vol. 81, Dec. 2001, pp. 645-651.

Elders, Job, Vincent Spiering, and Steve Walsh, *Microsystems Technology (MST) and MEMS Applications: An Overview*, MRS Bulletin, Apr. 2001, pp. 312-315.

Goldman, Ken, K. Sooriakumar, Cindy Ray, and Mark Schade, "Evaluating the use of hardmask films during bulk silicon etching," *MICRO Magazine*, Mar. 1997, p. 67, http://micromagazine.com/archive/97/03/goldman.html.

Kovacs, Gregory T.A., Nadim Maluf, and Kurt E. Petersen, "Bulk Micromachining of Silicon," *Proceedings of the IEEE*, vol. 86, No. 8, 1998, pp. 1536-1551.

Maluf, Nadim, *An Introduction to Microelectromachanical Systems Engineering*, Norwood, MA: Artech House, Inc., 2000, p. 60.

Robbins, H., and B. Schwartz, "Chemical Etching of Silicon: I. The System HF, $HNO_3$, and $H_2O$," *Journal of the Electrochemical Society*, vol. 106, No. 6, Jun. 1959, pp. 505-508.

Robbins, H., and B. Schwartz, "Chemical Etching of Silicon: II. The System HF, $HNO_3$, and $H_2O$, and $HC_2H_3O_2$," *Journal of the Electrochemical Society*, vol. 107, No. 2, Feb. 1960, pp. 108-111.

Yoon, Tae Hwan, Eun Jung Hwang, Dong Yong Shin, Se Ik Park, Seung Jae Oh, Sung Cherl Jung, Hyung Cheul Shin, and Sung June Kim, "A Micromachined Silicon Depth Probe for Multichannel Neural Recording," *IEEE Transactions on Biomedical Engineering*, vol. 47, No. 8, Aug. 2000.

Brar, Al.S. and Pradham, "Investigation of Microstructure of the Acrylonitrile-Styreeme-Glycidyl Methacrylate Terpolymers by 1D and 2D NMR Spectroscopy," Journal of Applied Polymer Science, vol. 89, 1779-1790 (2003); 2003 Wiley Periodicals, Inc.

Ciba Specialty Chemicals Inc., Photoacid Generators for Microlithography, Jan. 2003, printed in Switzerland, pp. 1-6.

Black et al., "Integration of self-assembled diblock copolymers for semiconductor capacitor fabrication," Applied Physics Letters, vol. 79, No. 3, Jul. 16, 2001, pp. 409-411.

Office Action in U.S. Appl. No. 11/470,520 dated Jun. 27, 2008, 15 pages.

Translation of JP 2004-264623 published Sep. 24, 2004, 30 pages, www19.ipdl.inpit.go.jp. . . .

Translation of WO 2006/046687 published May 4, 2006, 21 pages.

The International Search Report and Written Opinion of the International Searching Authority dated Jun. 5, 2008, in corresponding PCT application (PCT/US2008/054885, international filing date Feb. 25, 2008), 11 pages.

* cited by examiner

ALKALINE-RESISTANT NEGATIVE PHOTORESIST FOR SILICON WET-ETCH WITHOUT SILICON NITRIDE

BACKGROUND OF THE INVENTION

1. Field of the Invention

The present invention is concerned with new photoresists for use in the manufacture of microelectronic devices such as those used in microelectromechanical systems (MEMS).

2. Description of the Prior Art

It is common in silicon etching processes to utilize a thin (100- to 300-nm) silicon nitride or silicon dioxide coating on the silicon substrate as a mask for patterned etching or as a passivating layer to enclose active circuitry. In the prior art, etch protective coatings or masks for MEMS fabrication processes have been selected primarily by using a trial-and-error method because there are no general purpose protective coatings on the market. The etch selectivity of the etchants to various materials is often used as a guide for MEMS process engineers. With a much lower etch rate than silicon, films of silicon nitride have been used as a protective layer or hardmask during KOH or TMAH bulk silicon etching. Silicon dioxide has a higher etch rate than silicon nitride. Therefore, it is only used as a protective/mask layer for very short etches. Gold (Au), chromium (Cr), and boron (B) have also been reportedly used in some situations. Non-patterned, hardbaked photoresists have been used as masks, but they are readily etched in alkaline solutions. Polymethyl methacrylate was also evaluated as an etch mask for KOH. However, because of saponification of the ester group, the masking time of this polymer was found to decrease sharply from 165 minutes at 60° C. to 15 minutes at 90° C.

Regardless of the protective coating or mask selected, a photoresist layer to be patterned must be applied to the protective coating or mask so that the pattern can be transferred to the underlying substrate. However, this can only be carried out after the protective coating or mask has been applied, thus requiring time and expense to apply and later etch this protective layer or mask, which is very difficult to remove.

SUMMARY OF THE INVENTION

The present invention overcomes these problems by providing spin-applied, photosensitive coating systems that replace prior art masks or protective coatings, and that eliminate the need for additional photoresists in the system. The inventive systems protect device features from corrosion and other forms of attack during deep-etching processes that utilize concentrated aqueous bases.

The invention provides a photosensitive composition useful as a protective layer. The composition comprises a blend of a first polymer, a second polymer, and a photoacid generator in a solvent system. The first polymer comprises styrene-containing monomers and acrylonitrile-containing monomers, while the second polymer comprises epoxy-containing monomers.

In one embodiment, the second polymer also includes phenolic-containing monomers, which can be on the same monomers as the epoxy groups, on different monomers from the epoxy groups, or a mixture of both. The invention also provides methods of using these photosensitive compositions in conjunction with a primer layer to form microelectronic structures.

DETAILED DESCRIPTION OF THE PREFERRED EMBODIMENTS

Figure 1:
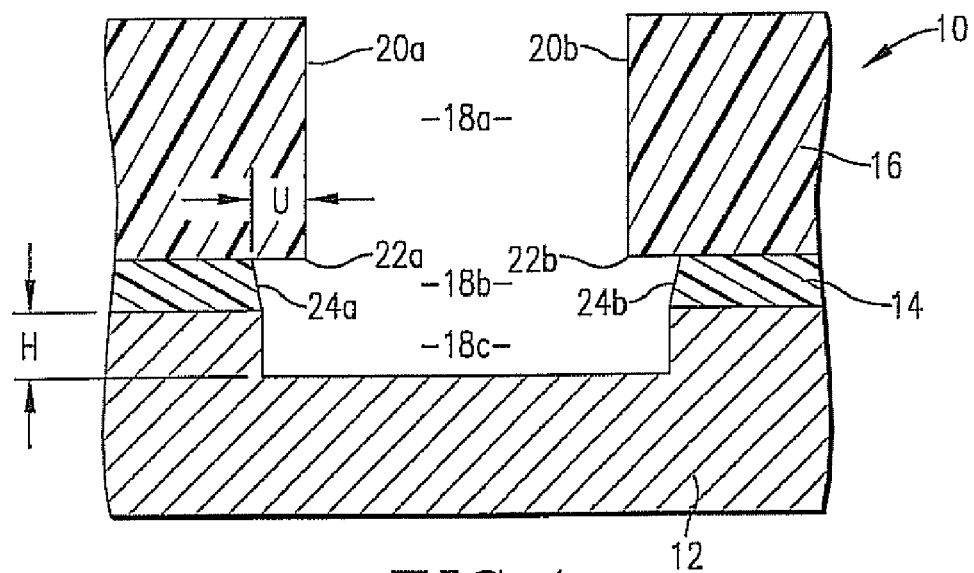
FIG. 1 is a sectional side view of a precursor structure according to the present invention.

In more detail, these systems preferably comprise a primer layer that is applied to a microelectronic substrate surface, and a photosensitive layer that is applied to the primer layer.

Primer Layer

Preferred primer layers are formed from primer layer compositions including a silane dispersed or dissolved in a solvent system. Aromatic and organo silanes are particularly preferred silanes for use in the primer layers of the invention. Furthermore, it is preferred that the silane include at least one (and more preferably 2-3) group per molecule of compound, or per repeat unit of polymer, that reacts with epoxy groups to form covalent bonds so that adhesion to a silicon substrate is very strong. One preferred such group is an amine group.

Preferred silanes include aminoalkoxysilanes, preferably from about $C_1$ to about $C_8$ alkoxys, more preferably from about $C_1$ to about $C_4$ alkoxys, and even more preferably from about $C_1$ to about $C_3$ alkoxys. Even more preferably, the aminoalkoxysilane is an aminoalkylalkoxysilane, preferably from about $C_1$ to about $C_8$ alkyls, more preferably from about $C_1$ to about $C_4$ alkyls, and even more preferably from about $C_1$ to about $C_3$ alkyls. Phenylaminoalkylalkoxysilanes are also preferred. Some examples of the foregoing include aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, and 3-mercaptopropyl-trimethoxysilane.

Other preferred silanes include phenylsilanes such as phenyltrimethoxysilane, phenyltrichlorosilane, phenyltriethoxysilane, phenyltriacetoxysilane, and diphenylsilanes such as diphenyldimethoxysilane, diphenyldichlorosilane, and diphenylsilanediol. The most preferred silanes include 2-phenylethyltrialkoxysilane, p/m-chlorophenyltrimethoxysilane, p/m-bromophenyltrimethoxysilane, (p/m-chloromethyl)phenyltrimethoxysilane, 2-(p/m-methoxy)phenylethyltrimethoxysilane, 2-(p/m-chloromethyl)phenylethyltrimethoxysilane, 3,4-dichlorophenyltrichlorosilane, 3-phenoxypropyltrichlorosilane, 3-(N-phenylamino)propyltrimethoxysilane, and 2-(diphenylphosphino)ethyltriethoxysilane.

Some preferred silanes for use in the present invention can also be represented by the general formula

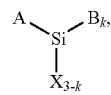

where:

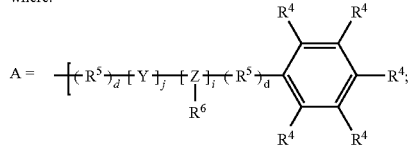

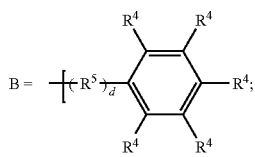

wherein:
each of i, j, and k is individually selected from the group consisting of 0 and 1, and if one of i and j is 1, then the other of i and j is 0;

each $R^4$ is individually selected from the group consisting of hydrogen, the halogens, $C_1$-$C_8$ (preferably $C_1$-$C_4$) alkyls, $C_1$-$C_8$ (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos;

each $R^5$ is individually selected from the group consisting of $C_1$-$C_8$ (preferably $C_1$-$C_4$) aliphatic groups;

each $R^6$ is individually selected from the group consisting of hydrogen and haloalkyls (preferably $C_1$-$C_8$, more preferably $C_1$-$C_4$);

each X is individually selected from the group consisting of halogens, hydroxyls, $C_1$-$C_4$ alkoxys and $C_1$-$C_4$ carboxyls;

Y is selected from the group consisting of oxygen and sulfur;

Z is selected from the group consisting of nitrogen and phosphorus; and each d is individually selected from the group consisting of 0 and 1.

An effective primer layer composition according to the invention is a mixture of a diphenyldialkoxysilane (e.g., diphenyldimethoxysilane) and a phenyltrialkoxysilane, (e.g., phenyltrimethoxysilane) or, even more preferably, a mixture of diphenylsilanediol and phenyltrimethoxysilane in a solution of 1-methoxy-2-propanol or 1-propoxy-2-propanol with from about 10-60% by weight water. A particularly effective primer layer composition for photosensitive layers comprising a poly(styrene-co-acrylonitrile) polymer is an alcohol and water solution containing from about 0.1-1.0% (preferably from about 0.25-0.5%) by weight diphenylsilanediol and from about 0.1-1.0% (preferably from about 0.25-0.5%) by weight of phenyltrimethoxysilane. Upon heating, diphenylsilanediol and phenylsilanetriol (the hydrolysis product of phenyltrimethoxysilane) condense to form siloxane bonds and establish a three-dimensional silicone coating layer on the substrate.

Another preferred silane has the formula

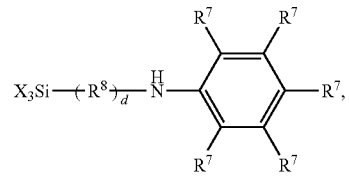

wherein:
each $R^7$ is individually selected from the group consisting of hydrogen, the halogens, $C_1$-$C_8$ (preferably $C_1$-$C_4$) alkyls, $C_1$-$C_8$ (preferably $C_1$-$C_4$) alkoxys, $C_1$-$C_8$ (preferably $C_1$-$C_4$) haloalkyls, aminos, and $C_1$-$C_8$ (preferably $C_1$-$C_4$) alkylaminos; and each $R^8$ is individually selected from the group consisting of $C_1$-$C_8$ (preferably $C_1$-$C_4$) aliphatic groups.

Silanes having this structure are not only compatible with styrene-containing copolymers, but they are also reactive with ester, benzyl chloride, and/or epoxy groups, and they are excellent adhesion promoters. One particularly preferred silane within the scope of this formula is

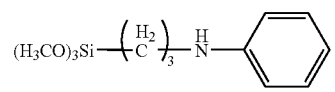

This silane is 3-[N-phenylamino]propyltrimethoxysilane (mentioned above), and it is commercially available from Lancaster Synthesis and Gelest Corporation.

The silane should be included in the primer layer composition at a level of from about 0.1% to about 3% by weight, preferably from about 0.2% to about 2% by weight, and even more preferably from about 0.5% to about 1% by weight, based upon the total weight of solids in the primer layer composition taken as 100% by weight.

The solvent system utilized in the primer layer composition should have a boiling point of from about 100° C. to about 220° C. and preferably from about 140° C. to about 180° C. The solvent system should be utilized at a level of from about 30% to about 99.9% by weight, and preferably from about 40% to about 80% by weight, based upon the total weight of the primer layer composition taken as 100% by weight. Preferred solvent systems include a solvent selected from the group consisting of methanol, ethanol, isopropanol, butanol, 1-methoxy-2-propanol, ethylene glycol monomethyl ether, propylene glycol propyl ether, and 1-propoxy-2-propanol, and mixtures thereof. In one preferred embodiment, water is included in the solvent system at a level of from about 20% to about 60% by weight, and preferably from about 40% to about 60% by weight, based upon the total weight of the primer layer composition taken as 100% by weight.

The primer layer composition can also include a catalyst. Suitable catalysts include any inorganic or organic acid (e.g., hydrochloric acid, sulfuric acid, phosphoric acid, acetic acid) or an inorganic or organic base (e.g., potassium hydroxide, TMAH, ammonia, amines). The catalyst is preferably present in the primer layer composition at levels of from about 0.01% to about 0.5% by weight, more preferably from about 0.1% to about 0.3% by weight, and even more preferably from about 0.02% to about 0.03% by weight, based upon the total weight of solids in the primer layer composition taken as 100% by weight.

Finally, the primer layer can also include a number of optional ingredients, such as a surfactant. In one embodiment, from about 100 ppm to about 400 ppm of a surfactant such as FC4430 (available from 3M) or Triton X-100 (available from 3M) can be added to make a uniform primer coating that is defect-free.

The Photosensitive Layer

The photosensitive layer is formed from a composition comprising at least two polymers dispersed or dissolved in a solvent system. The first polymer of the two polymers is preferably a copolymer comprising recurring styrene monomers and acrylonitrile monomers.

Preferred styrene monomers have the formula

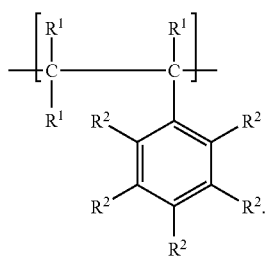

(I)

Preferred acrylonitrile monomers have the formula

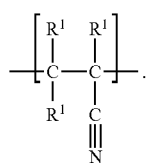

(II)

In each of the above formulas (I) and (II).
each $R^1$ is individually selected from the group consisting of hydrogen and $C_1$-$C_8$ (and preferably $C_1$-$C_4$) alkyls; and
each $R^2$ is individually selected from the group consisting of hydrogen, $C_1$-$C_8$ (and preferably $C_1$-$C_4$) alkyls, and $C_1$-$C_8$ (and preferably $C_1$-$C_4$) alkoxys.

The first polymer preferably comprises from about 50% to about 90% by weight of monomer (I), more preferably from about 60% to about 80% by weight of monomer (I), and even more preferably from about 70% to about 75% by weight of monomer (I). The first polymer preferably comprises from about 10% to about 50% by weight of monomer (II), more preferably from about 20% to about 40% by weight of monomer (II), and even more preferably from about 25% to about 30% by weight of monomer (II). Each of the above percentages by weight is based upon the total weight of the first polymer taken as 100% by weight.

It is preferred that the first polymer have a weight average molecular weight of from about 10,000 Daltons to about 80,000 Daltons, preferably from about 20,000 Daltons to about 60,000 Daltons, and even more preferably from about 30,000 Daltons to about 50,000 Daltons.

Monomers other than monomers (I) and (II) can also be present in the first polymer, if desired. When other monomers are present, the combined weight of monomers (I) and (II) in the polymer is preferably at least about 60% by weight, and more preferably from about 70% to about 90% by weight, based upon the total weight of the first polymer taken as 100% by weight. Examples of suitable other monomers include those having functional groups that can react with groups in the primer layer for achieving chemical bonding between the two layers. These monomers may have, by way of example, haloalkyl (e.g., benzyl chloride, 2-chloroethyl methacrylate), ester (methacrylates, acrylates, maleates, fumarates, isocyanates), or anhydride functional groups, which react readily with functional groups such as hydroxyl, amino, or oxiranyl groups that can be present in the primer layer.

The first polymer should be included in the photosensitive layer composition at a level of from about 30% to about 70% by weight, and preferably from about 50% to about 65% by weight, based upon the total weight of solids in the photosensitive layer composition taken as 100% by weight.

The second polymer present in the composition comprises recurring monomers having one or more epoxy groups per monomer, and preferably, the polyner comprises monomers having at least two epoxy groups per monomer. In a preferred embodiment, this second polymer also comprises monomers comprising a phenolic group. The phenolic group can be on separate monomers, or it can be included on the same monomer as the epoxy groups.

The second polymer preferably comprises from about 15% to about 30% by weight epoxy groups, and more preferably from about 20% to about 25% by weight of epoxy groups. In embodiments where a phenolic group is present, the polymer preferably comprises from about 40% to about 70% by weight of the phenolic group, and more preferably from about 50% to about 60% by weight of the phenolic group. Each of the above percentages by weight is based upon the total weight of the second polymer taken as 100% by weight.

It is preferred that the second polymer have a weight average molecular weight of from about 300 Daltons to about 10,000 Daltons, preferably from about 500 Daltons to about 5,000 Daltons, and even more preferably from about 1,000 Daltons to about 2,000 Daltons.

Preferred polymers for use as the second polymer in the photosensitive composition include those selected from the group consisting of epoxy phenol novolac resins (e.g., DEN 431, Dow Chemical), epoxy bisphenol A/F resins (e.g., DER 353, Dow Chemical), epoxy cresol novolac resins (e.g., ECN 1299, Ciba Geigy), epoxy bisphenol A resins (e.g., EPON 825, Dow Chemical), epoxy bisphenol A novolac resins (EPON SU-8, Dow Chemical), and mixtures thereof.

Monomers other than monomers containing epoxy and/or phenolic groups can also be present in the second polymer, if desired, provided that the epoxy quantities discussed above are achieved. Examples of suitable other monomers include those discussed above with respect to the first polymer.

The second polymer should be included in the photosensitive layer composition at a level of from about 20% to about 60% by weight, and preferably from about 25% to about 40% by weight, based upon the total weight of solids in the photosensitive layer composition taken as 100% by weight.

The photosensitive composition will also comprise a photoacid generator (PAG). The PAG generates a strong acid or superacid when exposed to actinic radiation such as UV light. Examples of suitable PAGs include those selected from the group consisting of triarylsulfonium hexafluoroantimonate, triarylsulfonium hexafluoro-phosphates (e.g., UVI 6976, Dow Chemical), diaryliodonium hexafluoroantimonate, diaryliodonium hexafluorophosphate,

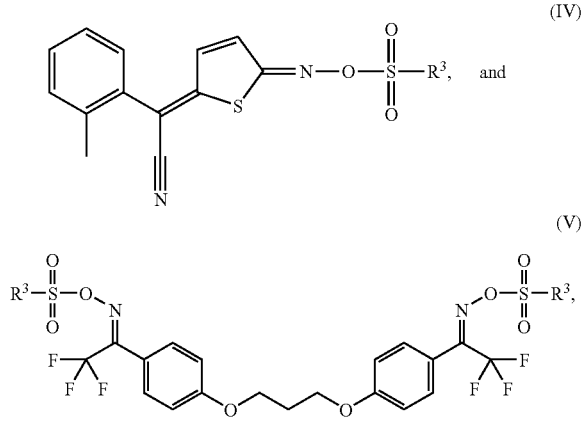

where each $R^3$ is individually selected from the group consisting of $C_3H_7$, $C_8H_{17}$, $CH_3C_6H_4$, and camphor. The PAGs of formulas (IV) and (V) are sold by Ciba Specialty Chemicals as The CGI 13XX Family and The CGI 26X Family, respectively.

The PAG should be included in the photosensitive composition at a level of from about 2% to about 10% by weight, and preferably from about 5% to about 8% by weight, based upon the total weight of solids in the photosensitive composition taken as 100% by weight.

The solvent system utilized in the photosensitive composition should have a boiling point of from about 120° C. to about 200° C. and preferably from about 130° C. to about 180° C. The solvent system should be utilized at a level of from about 70% to about 95% by weight, and preferably from about 80% to about 90% by weight, based upon the total weight of the photosensitive composition taken as 100% by weight. Preferred solvent systems include a solvent selected from the group consisting of methyl isoamyl ketone, di(ethylene glycol) dimethyl ether, propylene glycol monomethyl ether acetate, ethyl lactate, cyclohexanone, and mixtures thereof.

Application Process

Figure 2:
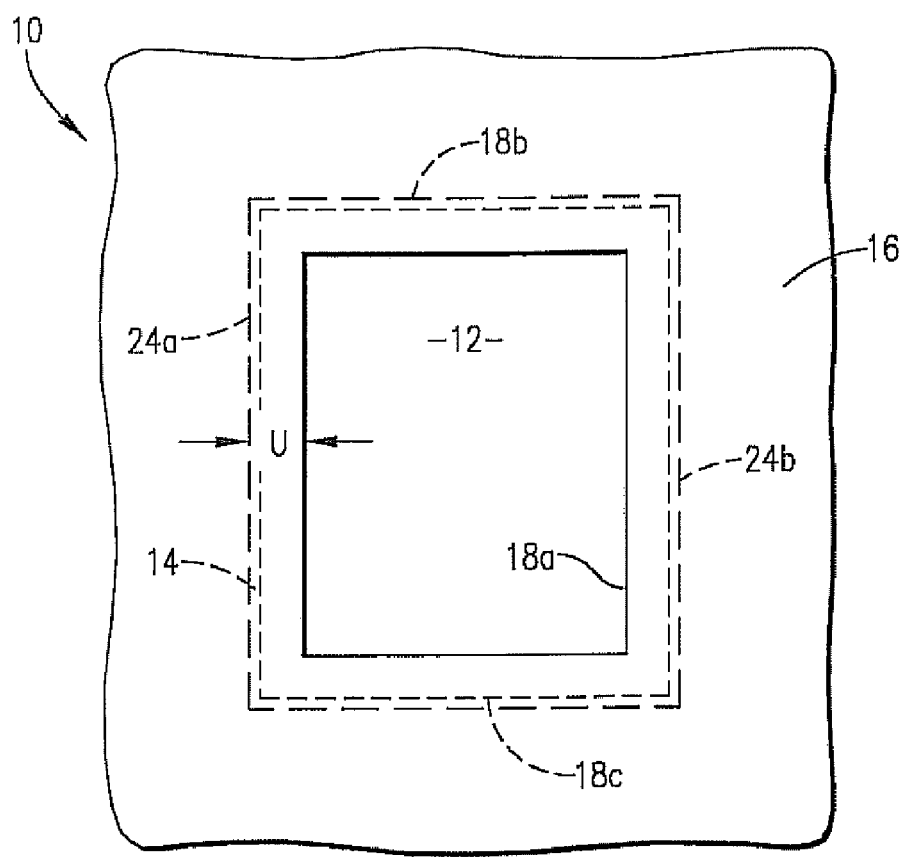
FIG. 2 is a plan view of the precursor structure illustrated in FIG. 1.

A precursor structure 10 is shown in FIGS. 1 and 2. Structure 10 includes a substrate 12. Preferred substrates for use in this process include those comprising silicon. Some particularly preferred substrates are selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

The silane and any other components are dissolved in the primer solvent system to form the silane composition. This composition is then spin-applied onto the substrate at about 500-5,000 rpm, and preferably from about 1000-3,000 rpm, for about 30-90 seconds, and preferably for about 60 seconds. It is then baked at a temperature of from about 60-110° C. for about 60-180 seconds (preferably about 60 seconds), and then at about 150-280° C. for about 60-180 seconds (preferably about 60 seconds) in order to condense the silane molecules into a continuous film 14 that is bonded to surface hydroxyl groups present on typical microelectronic substrates. That is, the hydrolyzed silane reacts with the silanol groups present in the silicon-containing substrate and also self-crosslinks by condensation. It is preferred that the primer layer have an average thickness (as measured by an ellipsometer over 5 different points) of less than about 50 nm and more preferably from about 20 nm to about 30 nm.

For the photosensitive layer, the first and second polymers, PAG, and any other components are dissolved in the solvent system (or mixed individually with respective solvents to form multiple solutions or dispersions that are then mixed together) and spin coated onto the substrate at about 1,000-5,000 rpm, and preferably from about 1,000-2,000 rpm, for about 30-90 seconds, and preferably about 60 seconds. It is then baked at a temperature of from about 100-120° C. for about 60-180 seconds (preferably about 120 seconds) to form photosensitive layer 16. The polymer solids level and spinning conditions are typically adjusted to achieve an average coating thickness after baking (as measured by an ellipsometer over 5 different points) of from about 500 nm to about 3,000 nm, and preferably from about 1,000 nm to about 2,000 nm, depending upon the degree of coverage required over device topography on the substrate. Advantageously, the epoxy or other reactive groups in the photosensitive layer polymers form covalent bonds with an amine or other reactive group on the silane of the primer layer.

The photosensitive layer is then imaged by exposing it to UV light with a wavelength of from about 150-500 nm (e.g., about 248 nm or about 365 nm), preferably in a dose of about 500 mJ/cm². The coating is then preferably post-exposure baked at about 110° C. to about 130° C. for about 2 minutes, and developed with a solvent for about 2 minutes. Finally, the coating is baked at about 200° C. to about 250° C. for about 3 minutes.

Exposure to light causes the PAG to generate an acid, and this acid initiates crosslinking of the epoxy groups in the photosensitive layer during the post-exposure bake. The crosslinked epoxy groups will have the structure

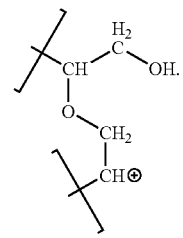

Thus, the cured photosensitive layer will comprise a plurality of these crosslinked epoxy groups, and potentially some intact (i.e., unreacted) epoxy groups.

The exposed areas become substantially insoluble (e.g., less than about 1% by weight soluble, preferably less than about 0.05% soluble, and more preferably about 0% soluble) in typical solvent developers such as propylene glycol monomethyl ether acetate, methyl isoamyl ketone, ethyl lactate, and ethyl acetoacetate. The unexposed areas remain soluble in these developers and are thus readily removed during developing to form an opening 18a in photosensitive layer 16. The opening 18a is defined by edges 20a and 20b, each having respective bottom points 22a and 22b.

The pattern can be easily transferred, with no additional etching steps (i.e., during the substrate etch step), to remove the protective layer 14 to form an opening 18b (defined by sidewalls 24a and 24b) in protective layer 14. That pattern is then transferred into the substrate 12 during this same etch step to form an opening 26 in substrate 12. Opening 18c has a height "H," and can be a via hole, contact hole, trench, space, etc.

As shown in FIG. 1, opening 18b has a width that is greater than that of 18a due to "undercutting" that typically occurs during etching processes. Practicing the present invention will result in a protective layer system that suffers little or no undercutting "U" during etching processes. That is, the % undercutting will be less than about 20%, preferably less than about 15%, and even more preferably less than about 10%, after etching for about 3 hours (or even about 4 hours) in an approximately 30-35% by weight aqueous KOH solution having a temperature of about 75-85° C.

Undercutting is determined by measuring (such as with a confocal microscope) the distance "U" from bottom point 22a to the point where sidewall 24a contacts photosensitive protective layer 16. The % undercutting is then determined by the following formula:

$$\% \text{ Undercutting} = \left(\frac{U}{H}\right) \times 100.$$

Furthermore, the inventive protective systems will experience very little or no etchant penetration during etching processes. Thus, when subjected for about 3 hours (or even about 4 hours) to etching in an approximately 30-35% by weight aqueous KOH solution having a temperature of about 75-85° C., the inventive protective layer 16 will have less than about 0.1 pinholes per $cm^2$ of substrate, and preferably less than about 0.05 pinholes per $cm^2$ of substrate, when observed under a microscope at 10× magnification. Prior art photosensitive layers typically dissolve relatively quickly in KOH, and thus require the presence of a separate protective layer such as a silicon nitride layer.

EXAMPLES

The following examples set forth preferred methods in accordance with the invention. It is to be understood, however, that these examples are provided by way of illustration and nothing therein should be taken as a limitation upon the overall scope of the invention.

Example 1

Primer Solution Formulation

To prepare a primer solution, 2.04 g of N-phenylaminopropyl-trimethoxysilane (obtained from Gelest, Morrisville, Pa.) were dissolved in a mixture of 77.50 g of propylene glycol propyl ether (PnP; obtained from General Chemical, Parsippany, N.J.), 120.14 g of deionized water, 0.51 g of acetic acid (obtained from Aldrich, Milwaukee, Wis.), and 0.03 g of FC-4430 (a surfactant, obtained from 3M, St. Paul, Minn.). The solution was stirred magnetically for more than 2 hours. It was then filtered through a 0.1-µm membrane filter.

Example 2

Copolymer Solution Preparation

A copolymer solution was made by dissolving 150.1 g of polystyrene-co-polyacrylonitrile copolymer (obtained from Bayer USA, Pittsburgh, Pa.) in a mixture of 595.0 g of propylene glycol methyl ether acetate (PGMEA; obtained from General Chemical, Parsippany, N.J.) and 255.0 g of ethyl acetoacetate (EAA; obtained from Harcros, Kansas City, Kans.).

Example 3

Photoacid Generator Solution Preparation

A photoacid generator (PAG) solution was made by dissolving 60.02 g of UVI-6976 (obtained from Dow Chemical, Midland, Mich.) in 140.08 g of PGMEA.

Example 4

Terpolymer Synthesis for Comparative Example 10

A solution was made by dissolving 168.0 g of styrene (obtained from Aldrich, Milwaukee, Wis.), 84.0 g of acrylonitrile (obtained from Aldrich, Milwaukee, Wis.), 28.3 g of glycidyl methacrylate (obtained from Aldrich, Milwaukee, Wis.), and 7.0 g of dicumyl peroxide (obtained from Aldrich, Milwaukee, Wis.) in 1,120 g of PGMEA. The solution was heated to 120° C. under nitrogen while undergoing magnetic stirring. The polymerization was allowed to proceed at 120° C. for 28 hours. The actual yield was found by solid analysis to be 97.5% of the theoretical. The terpolymer was precipitated in isopropanol, filtered, and dried overnight under vacuum at 50° C.

Example 5

Negative Photoresist Coating Comprising Epoxy Phenol Novolac Resin

1. Preparation of Topcoat Solution

A solution was made by dissolving 15.17 g of DEN 431 (epoxy phenol novolac resin, obtained from Dow Chemical, Midland Mich.) in a mixture of 59.57 g of PGMEA and 25.59 g of EAA. Next, 32.03 g of the copolyner solution prepared in Example 2 and 2.52 g of the PAG solution prepared in Example 3 were added to 15.53 g of this solution. The resulting topcoat solution was stirred and filtered through a 0.1-µm membrane filter.

2. Wafer Patterning

A pattern was transferred to the silicon wafer in a manner similar to prior art silicon nitride masking methods, but using the inventive composition. Specifically, the primer solution prepared in Example 1 was spin-coated onto a silicon wafer at 1,000 rpm for 1 minute. The wafer was baked at 110° C. for 1 minute and then at 280° C. for 1 minute. The topcoat solution prepared in Part 1 of this Example was spin-coated at 1,500 rpm for 1 minute and then baked at 110° C. for 2 minutes. The topcoat was image-wise exposed to UV light at 365 nm at a dose of 500 mJ/$cm^2$, followed by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220° C. for 5 minutes. A negative pattern was obtained.

3. Etch Testing

The wafer patterned in Part 2 of this Example was then etched in 30% KOH aqueous solution at 75° C. for 4 hours. The silicon was etched 165 µm deep in the area not covered with the polymer coating, and the polymer-coated area remained intact. Very little undercutting occurred, which was determined by measuring the width of overhanging protective layer at the edge of etched areas as observed under a confocal microscope. Undercutting was found to be 16.70 μm, i.e., 10.12% of etch depth.

Example 6

Negative Photoresist Coating Comprising Epoxy Bisphenol A/Bisphenol F Resin 1. Preparation of Topcoat Solution A solution was made by dissolving 15.02 g of DER 353 (an epoxy bisphenol A/bisphenol F resin, obtained from Dow Chemical, Midland, Mich.) in a mixture of 59.74 g of PGMEA and 25.39 g of EAA. Next, 32.00 g of the copolymer solution prepared in Example 2 and 2.52 g of the PAG solution prepared in Example 3 were added to 15.50 g of this solution. The resulting topcoat solution was stirred and filtered through a 0.1μm membrane filter.

2. Wafer Patterning

A pattern was transferred to the silicon wafer in a manner similar to prior art silicon nitride masking methods, but using the inventive composition. Specifically, the primer solution prepared in Example 1 was spin-coated onto a silicon wafer at 1,000 rpm for 1 minute. It was baked at 110° C. for 1 minute and then at 280° C. for 1 minute. The topcoat solution prepared in Part 1 of this Example was then spin-coated on top of the primer layer at 1,500 rpm for 1 minute, and was baked at 110° C. for 2 minutes. The topcoat was image-wise exposed to UV light at 365 nm at a dose of 500 mJ/cm$^2$, followed by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220° C. for 5 minutes. A negative pattern was obtained.

3. Etch Testing

The wafer that was patterned in Part 2 of this Example was etched in 30% KOH aqueous solution at 75° C. for 4 hours. The silicon was etched 165 μm deep in the area not covered with polymer coating. The polymer-coated area remained intact. Very little undercutting occurred, which was determined by measuring the width of overhanging protective layer at the edge of etched areas as observed under a confocal microscope. Undercutting was found to be 16.74 μm, i.e., 10.14% of etch depth.

Example 7

Negative Photoresist Coating Comprising Epoxy Cresol Novolac Resin

1. Preparation of Topcoat Solution

A solution was made by dissolving 30.01 g of ECN 1299 (an epoxy cresol novolac resin, obtained from Ciba Geigy, Tarrytown, N.Y.) in a mixture of 119.07 g of PGMEA and 51.03 g of EAA. Next, 32.06 g of the copolymer solution prepared in Example 2 and 2.52 g of the PAG solution prepared in Example 3 were added to 15.51 g of this solution. The resulting topcoat solution was stirred and filtered through a 0.1-μm membrane filter.

2. Wafer Patterning

The primer solution prepared in Example 1 was spin-coated onto a silicon wafer at 1,000 rpm for 1 minute. It was baked at 110° C. for 1 minute and then at 280° C. for 1 minute. The topcoat solution prepared in Part 1 of this Example was then spin-coated on top of the primer layer at 1,500 rpm for 1 minute, and was baked at 110° C. for 2 minutes. The topcoat was image-wise exposed to UV light at 365 nm at a dose of 500 mJ/cm$^2$, followed by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220° C. for 5 minutes. A negative pattern was obtained.

3. Etch Testing

A pattern was transferred to the silicon wafer in a manner similar to prior art silicon nitride masking methods, but using the inventive composition. Specifically, the wafer that was patterned in Part 2 of this Example was etched in 30% KOH aqueous solution at 75° C. for 4 hours. The silicon was etched 165 μm deep in the area not covered with polymer coating. The polymer-coated area remained intact. Very little undercutting occurred, which was determined by measuring the width of overhanging protective layer at the edge of etched areas as observed under a confocal microscope. Undercutting was found to be 23.96 μm, i.e., 14.52% of etch depth,

Example 8

Negative Photoresist Coating Comprising Epoxy Bisphenol A Resin

1. Preparation of Topcoat Solution

A solution was made by dissolving 15.04 g of Epon 825 (an epoxy bisphenol A resin, obtained from Dow Chemical, Midland, Mich.) in a mixture of 59.52 g of PGMEA and 25.53 g of EAA. Next, 32.08 g of the copolymer solution prepared in Example 2 and 2.52 g of the PAG solution prepared in Example 3 were added to 15.53 g of this solution. The resulting topcoat solution was stirred and filtered through a 0.1-μm membrane filter.

2. Wafer Patterning

The primer solution prepared in Example 1 was spin-coated onto a silicon wafer at 1,000 rpm for 1 minute. It was baked at 110° C. for 1 minute and then at 280° C. for 1 minute. The topcoat solution prepared in Part 1 of this Example was then spin-coated on top of the primer layer at 1,500 rpm for 1 minute, and was baked at 110° C. for 2 minutes. The topcoat was image-wise exposed to UV light at 365 nm at a dose of 500 mJ/cm$^2$, followed by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220° C. for 5 minutes. A negative pattern was obtained.

3. Etch Testing

A pattern was transferred to the silicon wafer in a manner similar to prior art silicon nitride masking methods, but using the inventive composition. Specifically, the wafer that was patterned in Part 2 of this Example was etched in 30% KOH aqueous solution at 75° C. for 4 hours. The silicon was etched 165 μm deep in the area not covered with polymer coating. The polymer-coated area remained intact. Very little undercutting occurred, which was determined by measuring the width of overhanging protective layer at the edge of etched areas as observed under a confocal microscope. Undercutting was found to be 16.04 μm, i.e., 9.72% of etch depth.

Example 9

Negative Photoresist Coating Comprising Epoxy Bisphenol A Novolac Resin

1. Preparation of Topcoat Solution

A solution was made by dissolving 15.07 g of Epon SU-8 (an epoxy bisphenol A novolac resin, obtained from Dow Chemical, Midland, Mich.) in a mixture of 59.51 g of PGMEA and 25.52 g of EAA. Next, 32.00 g of the copolymer solution prepared in Example 2 and 2.50 g of the PAG solution prepared in Example 3 were added to 15.50 g of this solution. The resulting topcoat solution was stirred and filtered through a 0.1-μm membrane filter.

2. Wafer Patterning

The primer solution prepared in Example 1 was spin-coated onto a silicon wafer at 1,000 rpm for 1 minute. It was baked at 110° C. for 1 minute and then at 280° C. for 1 minute. The topcoat solution prepared in Part 1 of this Example was then spin-coated on top of the primer layer at 1,500 rpm for 1 minute, and was baked at 110° C. for 2 minutes. The topcoat was image-wise exposed to UV light at 365 nm at a dose of 500 mJ/cm$^2$, followed by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220 ° C. for 5 minutes. A negative pattern was obtained.

3. Etch Testing

A pattern was transferred to the silicon wafer in a manner similar to prior art silicon nitride masking methods, but using the inventive composition. Specifically, the wafer that was patterned in Part 2 of this Example was etched in 30% KOH aqueous solution at 75° C. for 4 hours. The silicon was etched 165 μm deep in the area not covered with polymer coating. The polymer-coated area remained intact. Very little undercutting occurred, which was determined by measuring the width of overhanging protective layer at the edge of etched areas as observed under a confocal microscope. Undercutting was found to be 22.32 in, i.e., 13.53% of etch depth.

Example 10

Comparative Example

Negative Photoresist Coating Comprising Terpolymer

1. Preparation of Topcoat Solution

A solution was made by dissolving 32.05 g of the terpolymer prepared in Example 4 in a mixture of 140.05 g of PGMEA and 40.00 g of EAA. Next, 4.52 g of UVI-6976 were added to this solution. The resulting topcoat solution was stirred and filtered through a 0.1-μm membrane filter.

2. Wafer Patterning

The primer solution prepared in Example 1 was spin-coated onto a silicon wafer at 1,000 rpm for 1 minute. It was baked at 110° C. for 1 minute and then at 280° C. for 1 minute. The topcoat solution prepared in Part 1 of this Example was then spin-coated on top of the primer layer at 1,500 rpm for 1 minute, and was baked at 110° C. for 2 minutes. The topcoat was image-wise exposed to UV light at 365 nm at a dose of 500 mJ/cm$^2$, followed, by baking at 110° C. for 2 minutes. After baking, the topcoat was developed by applying ethyl lactate at 200 rpm for 90 seconds, rinsed with isopropanol at 300 rpm for 30 second, and spin-dried at 2,000 rpm for 30 seconds. Finally, the wafer was baked at 220° C. for 5 minutes. A negative pattern was obtained.

3. Etch Testing

A pattern was transferred to the silicon wafer in a manner similar to prior art silicon nitride masking methods. Specifically, the wafer that was patterned in Part 2 of this Example was etched in 30% KOH aqueous solution at 75° C. for 4 hours. The silicon was etched 160 μm deep in the area not covered with polymer coating. The polymer-coated area remained intact. The undercutting was determined by measuring the width of overhanging protective layer at the edge of etched areas as observed under a confocal microscope. Undercutting was found to be 65.78 μm, i.e., 41.11% of etch depth.

We claim:

1. A photosensitive composition useful as a protective layer, said composition being alkaline-resistant and negative-acting and said composition comprising a first polymer, a second polymer, and a photoacid generator dissolved or dispersed in a solvent system, wherein:

said first polymer comprises:

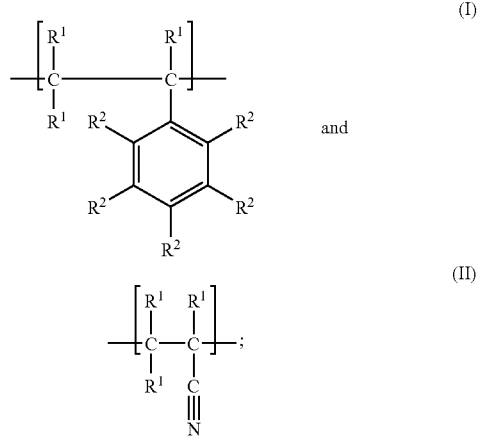

wherein:
each $R^1$ is individually selected from the group consisting of hydrogen and $C_1$-$C_8$ alkyls; and
each $R^2$ is individually selected from the group consisting of hydrogen, and $C_1$-$C_8$ alkyls, wherein said first polymer comprises from about 50% to about 90% by weight of (I) and from about 10% to about 50% by weight of (II); and said second polymer comprises recurring monomers comprising epoxy groups.

2. The composition of claim 1, wherein said second polymer further comprises recurring monomers comprising phenolic groups.

3. The composition of claim 1, wherein said second polymer is selected from the group consisting of epoxy phenol novolac resins, epoxy bisphenol A/F resins, epoxy cresol novolac resins, epoxy bisphenol A resins, and epoxy bisphenol A novolac resins.

4. The composition of claim 1, wherein said photoacid generator is selected from the group consisting of triarylsulfonium hexafluoroantimonate, triarylsulfonium hexafluorophosphates, diaryliodonium hexafluoroantimonate, diaryliodonium hexafluorophosphate,

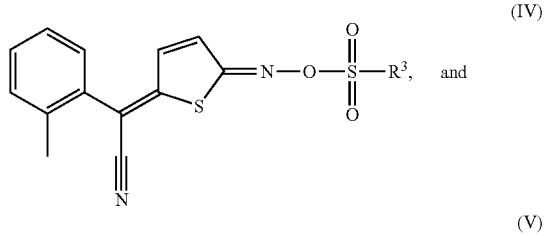

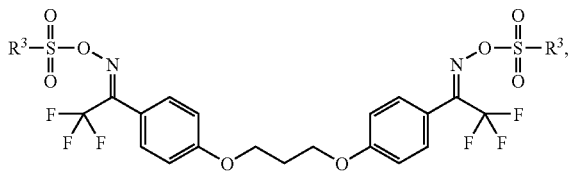

wherein each $R^3$ is individually selected from the group consisting of $C_3H_7$, $C_8H_{17}$, $CH_3C_6H_4$, and camphor.

5. A method of forming a microelectronic structure, said method comprising:
   providing a microelectronic substrate;
   applying a primer layer to said substrate, said primer layer comprising a silane dispersed or dissolved in a solvent system;
   applying a photosensitive layer to said primer layer, said photosensitive layer being alkaline-resistant and comprising a photoacid generator, a first polymer, and a second polymer dispersed or dissolved in a solvent system, wherein:
   said first polymer comprises:

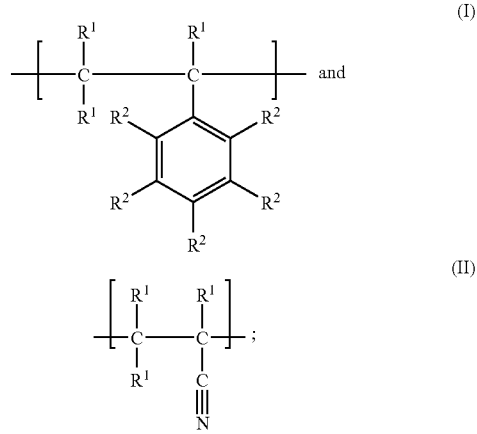

wherein:
      each $R^1$ is individually selected from the group consisting of hydrogen and $C_1$-$C_8$ alkyls; and
      each $R^2$ is individually selected from the group consisting of hydrogen, and $C_1$-$C_8$ alkyls, wherein said first polymer comprises from about 50% to about 90% by weight of (I) and from about 10% to about 50% by weight of (II); and
   said second polymer comprises recurring monomers comprising epoxy groups.

6. The method of claim 5, wherein said second polymer further comprises recurring monomers comprising phenolic groups.

7. The method of claim 5, wherein said second polymer is selected from the group consisting of epoxy phenol novolac resins, epoxy bisphenol A/F resins, epoxy cresol novolac resins, epoxy bisphenol A resins, and epoxy bisphenol A novolac resins.

8. The method of claim 5, wherein said photoacid generator is selected from the group consisting of triarylsulfonium hexafluoroantimonate, triarylsulfonium hexafluoro-phosphates, diaryliodonium hexafluoroantimonate, diaryliodonium hexafluorophosphate,

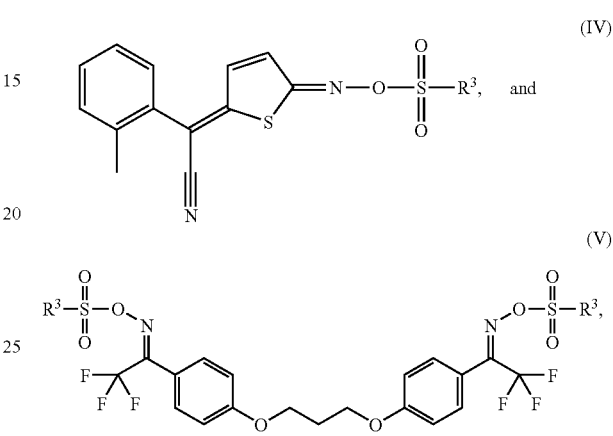

wherein each $R^3$ is individually selected from the group consisting of $C_3H_7$, $C_8H_{17}$, $CH_3C_6H_4$, and camphor.

9. The method of claim 5, wherein said polymer comprises from about 50% to about 90% by weight of (I) and from about 10% to about 50% by weight of (II), based upon the total weight of the polymer taken as 100% by weight.

10. The method of claim 5, said silane having a formula selected from the group consisting of

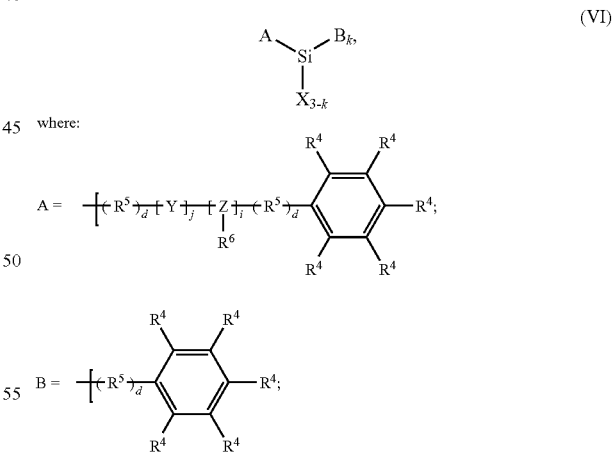

where:

each of i, j, and k is individually selected from the group consisting of 0 and 1, and if one of i and j is 1, then the other of i and j is 0;
each $R^4$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos;
each $R^5$ is individually selected from the group consisting of $C_1$-$C_8$ aliphatic groups;

each $R^6$ is individually selected from the group consisting of hydrogen and haloalkyls;

each X is individually selected from the group consisting of halogens, hydroxyls, $C_1$-$C_4$ alkoxys and $C_1$-$C_4$ carboxyls;

Y is selected from the group consisting of oxygen and sulfur;

Z is selected from the group consisting of nitrogen and phosphorus; and each d is individually selected from the group consisting of 0 and 1; and

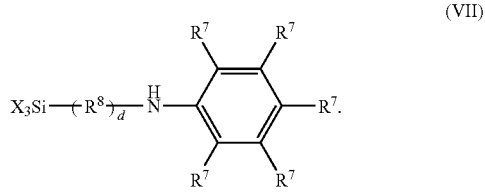

(VII)

wherein:

each $R^7$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos; and each $R^8$ is individually selected from the group consisting of $C_1$-$C_8$ aliphatic groups.

11. The method of claim 5, said silane being selected from the group consisting of aminoalkoxysilanes, phenylsilanes, and diphenylsilanes.

12. The method of claim 11, wherein said silane is selected from the group consisting of aminoalkylalkoxysilanes and phenylaminoalkylalkoxysilanes.

13. The method of claim 11, wherein said silane is selected from the group consisting of aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, 3-mercaptopropyl-trimethoxysilane, phenyltrimethoxysilane, phenyltrichlorosilane, phenyltriethoxysilane, phenyltriacetoxysilane, diphenyldimethoxysilane, diphenyldichlorosilane, diphenylsilanediol 2-phenylethyltrialkoxysilane, p/m-chlorophenyltrimethoxysilane, p/m-bromophenyltrimethoxysilane, (p/m-chloromethyl)phenyltrimethoxysilane, 2-(p/m-methoxy)phenylethyltrimethoxysilane, 2-(p/m-chloromethyl)phenylethyltrimethoxysilane, 3,4-dichlorophenyltrichlorosilane, 3-phenoxypropyltrichlorosilane, 3-(N-phenylamino)propyltrimethoxysilane, and 2-(diphenylphosphino)ethyltriethoxysilane.

14. The method of claim 5, further comprising baking said primer layer after said primer layer applying.

15. The method of claim 14, wherein said primer layer further comprises a catalyst, and said primer layer baking results in crosslinking of said silane.

16. The method of claim 5, further comprising baking said photosensitive layer after said photosensitive layer applying.

17. The method of claim 16, wherein said baking causes at least one of said polymers of said photosensitive layer to covalently bond with the silane of said primer layer.

18. The method of claim 5, further comprising exposing a first portion of said photosensitive layer to actinic radiation while a second portion of said photosensitive layer is not exposed to actinic radiation.

19. The method of claim 18, further comprising baking said photosensitive layer after said exposing to actinic radiation.

20. The method of claim 19, wherein said first portion of said photosensitive layer crosslinks during said baking.

21. The method of claim 19, further comprising developing said photosensitive layer.

22. The method of claim 21, wherein said developing results in the second portion of said photosensitive layer being substantially removed during said developing step so as to form a stack including a photosensitive layer having a pattern formed therein.

23. The method of claim 22, further comprising baking said photosensitive layer after said developing.

24. The method of claim 22, further comprising etching said stack so as to transfer the pattern of said photosensitive layer to said substrate.

25. The method of claim 24, wherein said photosensitive layer exhibits less than about 20% undercutting after said etching.

26. The method of claim 24, wherein said photosensitive layer exhibits less than about 0.1 pinholes per $cm^2$ of substrate.

27. The method of claim 5, wherein said substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

28. A microelectronic structure comprising:

a microelectronic substrate;

a primer layer adjacent said substrate, said primer layer comprising a crosslinked silane;

a photosensitive layer adjacent said primer layer, said photosensitive layer being alkaline-resistant and comprising:

a first polymer comprising:

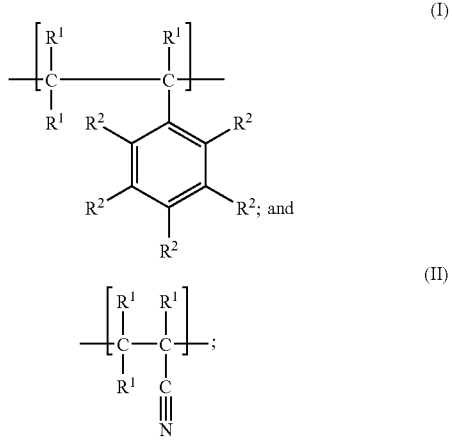

wherein:

each $R^1$ is individually selected from the group consisting of hydrogen and $C_1$-$C_8$ alkyls; and each $R^2$ is individually selected from the group consisting of hydrogen, and $C_1$-$C_8$ alkyls, wherein said first polymer comprises from about 50% to about 90% by weight of (I) and from about 10% to about 50% by weight of (II); and a second polymer comprising recurring monomers comprising crosslinked epoxy groups.

29. The microelectronic structure of claim 28, wherein said second polymer further comprises recurring monomers comprising phenolic groups.

30. The microelectronic structure of claim 28, wherein said second polymer is selected from the group consisting of epoxy phenol novolac resins, epoxy bisphenol A/F resins, epoxy cresol novolac resins, epoxy bisphenol A resins, and epoxy bisphenol A novolac resins.

31. The microelectronic structure of claim 28, wherein said silane comprises an amine, and the second polymer of said photosensitive layer comprises an epoxy group covalently bonded with said amine.

32. The microelectronic structure of claim 28, wherein said polymer comprises from about 50% to about 90% by weight of (I) and from about 10% to about 50% by weight of (II), based upon the total weight of the polymer taken as 100% by weight.

33. The microelectronic structure of claim 28, said silane having a formula selected from the group consisting of

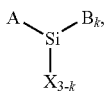

(VI)

where:

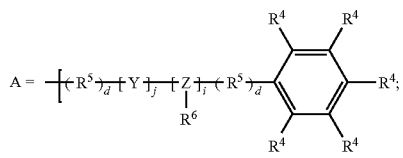

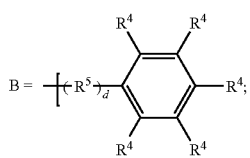

each of i, j, and k is individually selected from the group consisting of 0 and 1, and if one of i and j is 1, then the other of i and j is 0;
each $R^4$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos;
each $R^5$ is individually selected from the group consisting of $C_1$-$C_8$ aliphatic groups;
each $R^6$ is individually selected from the group consisting of hydrogen and haloalkyls;
each X is individually selected from the group consisting of halogens, hydroxyls, $C_1$-$C_4$ alkoxys and $C_1$-$C_4$ carboxyls;
Y is selected from the group consisting of oxygen and sulfur;
Z is selected from the group consisting of nitrogen and phosphorus; and
each d is individually selected from the group consisting of 0 and 1; and

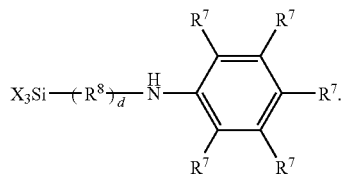

(VII)

wherein:
each $R^7$ is individually selected from the group consisting of hydrogen, the halogens, $C_1$-$C_8$ alkyls, $C_1$-$C_8$ alkoxys, $C_1$-$C_8$ haloalkyls, aminos, and $C_1$-$C_8$ alkylaminos; and
each $R^8$ is individually selected from the group consisting of $C_1$-$C_8$ aliphatic groups.

34. The microelectronic structure of claim 28, said silane being selected from the group consisting of aminoalkoxysilanes, phenylsilanes, and diphenylsilanes.

35. The microelectronic structure of claim 34, wherein said silane is selected from the group consisting of aminoalkylalkoxysilane and phenylaminoalkylalkoxysilanes.

36. The microelectronic structure of claim 34, wherein said silane is selected from the group consisting of aminopropyltrimethoxysilane, aminopropyltriethoxysilane, N-phenylaminopropyltrimethoxysilane, N-phenylaminopropyltriethoxysilane, 3-glycidoxypropyltrimethoxysilane, 2-(3,4-epoxycyclohexyl)ethyltrimethoxysilane, 3-mercaptopropyltrimethoxysilane, phenyltrimethoxysilane, phenyltrichlorosilane, phenyltriethoxysilane, phenyltriacetoxysilane, diphenyldimethoxysilane, diphenyldichlorosilane, diphenylsilanediol 2-phenylethyltrialkoxysilane, p/m-chlorophenyltrimethoxysilane, p/m-bromophenyltrimethoxysilane,(p/m-chloromethyl) phenyltrimethoxysilane, 2-(p/m-methoxy) phenylethyltrimethoxysilane, 2-(p/m-chloromethyl) phenylethyltrimethoxysilane, 3,4-dichlorophenyltrichlorosilane, 3-phenoxypropyltrichlorosilane, 3-(N-phenylamino)propyltrimethoxysilane, and 2-(diphenylphosphino)ethyltriethoxysilane.

37. The microelectronic structure of claim 28, wherein said substrate is selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal substrates.

38. The microelectronic structure of claim 28, wherein said crosslinked epoxy groups have the formula

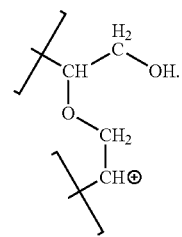

39. The composition of claim 1, wherein said first polymer first polymer comprises from about 60% to about 80% by weight of (I) and from about 20% to about 40% by weight of (II).

40. The composition of claim 1, wherein said first polymer is a copolymer of (I) and (II).

* * * * *

UNITED STATES PATENT AND TRADEMARK OFFICE
CERTIFICATE OF CORRECTION

PATENT NO. : 7,709,178 B2
APPLICATION NO. : 11/736429
DATED : May 4, 2010
INVENTOR(S) : Xing-Fu Zhong et al.

It is certified that error appears in the above-identified patent and that said Letters Patent is hereby corrected as shown below:

In the Specifications:

Please insert the following at column 1, line 5

--FEDERALLY SPONSORED RESEARCH/DEVELOPMENT PROGRAM

This invention was made with Government support under Contract Number N00014-07-C-0797 awarded by the Department of the Navy. The Government has certain rights in the invention.--

Signed and Sealed this
Fourteenth Day of May, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,709,178 B2 | Page 1 of 1 |
| APPLICATION NO. | : 11/736429 | |
| DATED | : May 4, 2010 | |
| INVENTOR(S) | : Xing-Fu Zhong, Tony D. Flaim and Jyoti Malhotra | |

It is certified that error appears in the above-identified patent and that said Letters Patent is hereby corrected as shown below:

In the Claims

Column 20, lines 58-59, the text "first polymer first polymer" should read:

-- first polymer --

Signed and Sealed this
Twenty-second Day of July, 2014

Michelle K. Lee
*Deputy Director of the United States Patent and Trademark Office*